US011823742B2

(12) United States Patent
Helm et al.

(10) Patent No.: US 11,823,742 B2
(45) Date of Patent: Nov. 21, 2023

(54) ACCELERATION OF DATA QUERIES IN MEMORY

(71) Applicant: Micron Technology, Inc., Boise, ID (US)

(72) Inventors: Mark A Helm, Santa Cruz, CA (US); Joseph T. Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/704,687

(22) Filed: Mar. 25, 2022

(65) Prior Publication Data

US 2022/0215885 A1 Jul. 7, 2022

Related U.S. Application Data

(63) Continuation of application No. 16/984,452, filed on Aug. 4, 2020, now Pat. No. 11,289,166.

(51) Int. Cl.
*G11C 16/12* (2006.01)
*G11C 16/24* (2006.01)
*G11C 7/10* (2006.01)

(52) U.S. Cl.
CPC ............ *G11C 16/12* (2013.01); *G11C 7/1084* (2013.01); *G11C 16/24* (2013.01)

(58) Field of Classification Search
CPC ........ G11C 16/12; G11C 7/1084; G11C 16/24
USPC .................................................... 365/185.23
See application file for complete search history.

(56) References Cited

U.S. PATENT DOCUMENTS

| 7,058,642 | B2 | 6/2006 | Kurupati et al. |
| 10,032,496 | B1 | 7/2018 | Bedeschi et al. |
| 10,318,378 | B2 | 6/2019 | Hoei et al. |
| 11,289,166 | B2 * | 3/2022 | Helm ................... G11C 15/046 |
| 2004/0037152 | A1 | 2/2004 | Ooishi |
| 2009/0323384 | A1 | 12/2009 | Lam |
| 2014/0136758 | A1 | 5/2014 | Sprouse et al. |
| 2015/0016172 | A1 | 1/2015 | Loh |
| 2016/0284402 | A1 | 9/2016 | Kanai |
| 2017/0068464 | A1 | 3/2017 | Crawford |
| 2018/0012034 | A1 | 1/2018 | Rozenberg et al. |
| 2019/0171839 | A1 | 6/2019 | Rozenberg et al. |
| 2019/0220230 | A1 | 7/2019 | Khan et al. |
| 2020/0211640 | A1 | 7/2020 | Sharon et al. |

OTHER PUBLICATIONS

International Search Report and Written Opinion from related International Patent Application No. PCT/US2021044320, dated Nov. 15, 2021, 12 pages.

* cited by examiner

*Primary Examiner* — Huan Hoang
(74) *Attorney, Agent, or Firm* — Brooks, Cameron & Huebsch, PLLC

(57) ABSTRACT

The present disclosure includes apparatuses and methods for acceleration of data queries in memory. A number of embodiments include an array of memory cells, and processing circuitry configured to receive, from a host, a query for particular data stored in the array of memory cells, wherein the particular data corresponds to a search key generated by the host, search portions of the array of memory cells for the particular data corresponding to the search key, determine data stored in the portions of the array of memory cells that matches the search key, and transfer the data that matches the search key to the host.

19 Claims, 7 Drawing Sheets

ACCELERATION OF DATA QUERIES IN MEMORY

PRIORITY INFORMATION

This application is a Continuation of U.S. application Ser. No. 16/984,452 filed on Aug. 4, 2020, which will issue as U.S. Pat. No. 11,289,166 on Mar. 29, 2022, the contents of which are incorporated herein by reference.

TECHNICAL FIELD

The present disclosure relates generally to semiconductor memory apparatuses and methods, and more particularly, to apparatuses and methods for acceleration of data queries in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing an operation on data (e.g., one or more operands). As used herein, an operation can be, for example, a Boolean operation, such as AND, OR, NOT, NAND, NOR, and XOR, and/or other operations (e.g., invert, shift, arithmetic, statistics, among many other possible operations). In many instances, the processing resources may be external to the memory array, and data may be accessed via a bus between the processing resources and the memory array to execute a set of instructions.

DETAILED DESCRIPTION

Figure 1:
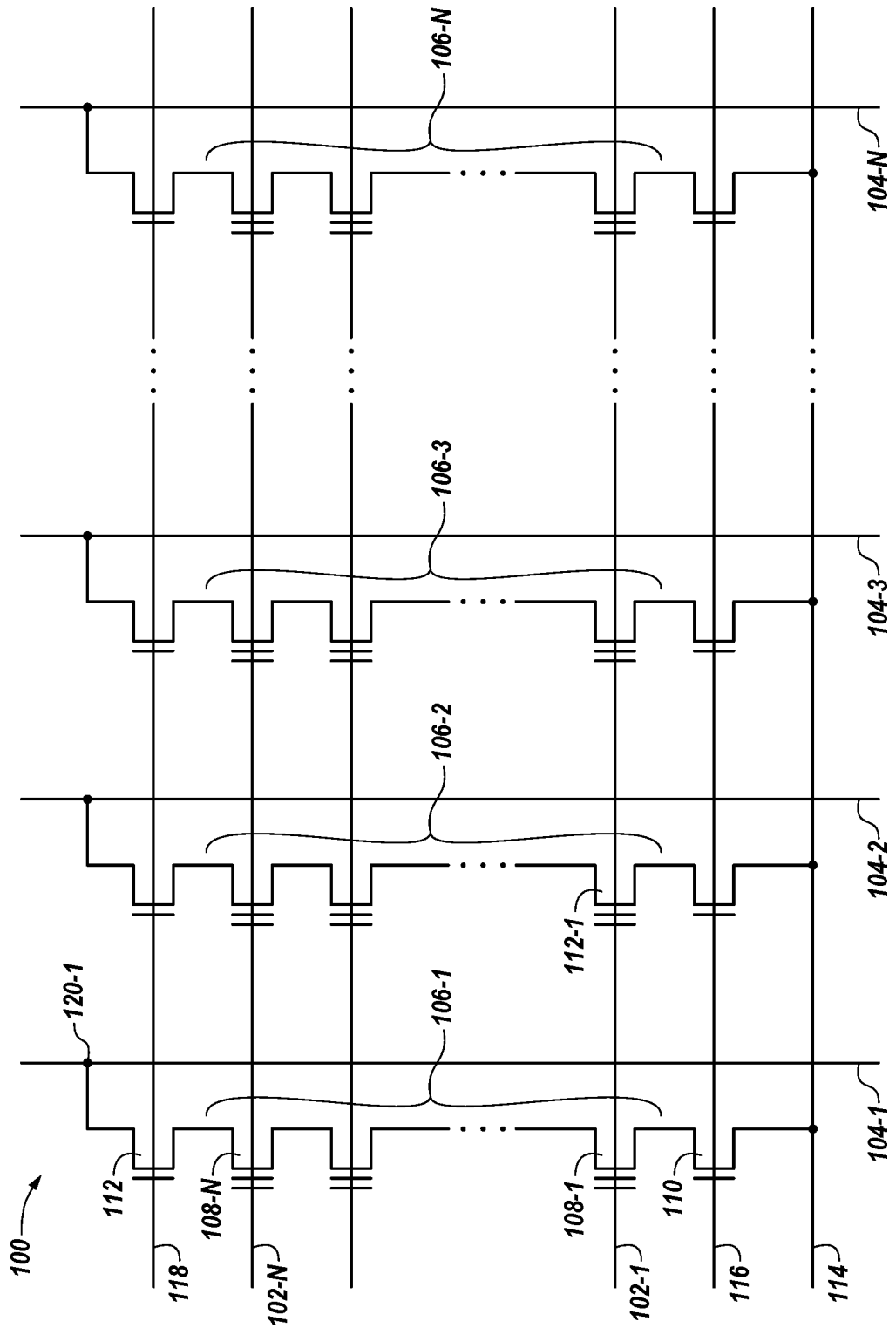
FIG. 1 is a schematic diagram of a portion of a memory array in accordance with a number of embodiments of the present disclosure.

The present disclosure includes apparatuses and methods for acceleration of data queries in memory, such as three-dimensional memory, as opposed to a separate integrated circuit dedicated to processing, like a CPU, GPU, ASIC or FGPA. A number of embodiments include an array of memory cells, and processing circuitry configured to receive, from a host, a query for particular data stored in the array of memory cells, wherein the particular data corresponds to a search key generated by the host, search portions of the array of memory cells for the particular data corresponding to the search key, determine data stored in the portions of the array of memory cells that matches the search key, and transfer the data that matches the search key to the host.

Memory, such as, for instance, 3D NAND flash memory, can be used as a database in a computing system. In some previous approaches, the coordination of queries (e.g., searches) for data stored in the memory (e.g., in the database) can be controlled by circuitry external to the memory. For example, in some previous approaches, when a user of a host computing device coupled to the memory issues a query for some particular data stored in the memory, data (e.g., pages of data) stored in the memory is transferred from the memory to the host, and the host then processes the received data to identify any data included therein that matches the query (e.g., that satisfies the parameters of the query). For instance, the host may perform operations, such as, for instance, arithmetic operations, on the data to identify the data from the memory that matches the query.

Controlling data queries via circuitry external to the memory in such a manner, however, may be inefficient due to the amount of time (e.g., delay) associated with transferring (e.g., sending) all the data from the memory to the external circuitry (e.g., host) for processing. This delay may be further exacerbated by bandwidth bottlenecks that may occur between the memory and the host.

In contrast, embodiments of the present disclosure can utilize circuitry that is resident on (e.g., physically located on or tightly coupled to) the memory to process a data query issued by the host (e.g., to identify the data stored in the memory that matches the query). For instance, embodiments of the present disclosure can utilize circuitry resident on 3D NAND to perform operations needed to identify the data that matches (e.g., perfectly and/or exactly matches) the query, such that only the data in the memory that matches the query is sent to the host (e.g., rather than having to send all data from the memory to the host for processing).

Accordingly, embodiments of the present disclosure can accelerate (e.g., increase the speed of) data queries as compared to previous approaches (e.g., approaches in which the queries are controlled via external circuitry). Additionally, embodiments of the present disclosure can perform the operations of the data query on multiple portions of the data stored in the memory in parallel, which can further accelerate the query.

As used herein, the designator "N", particularly with respect to reference numerals in the drawings, indicates that a number of the particular feature so designated can be included with a number of embodiments of the present disclosure. Additionally, as used herein, "a", "an", or "a number of" something can refer to one or more of such things, and "a plurality of" something can refer to two or more such things. For example, a number of memory cells can refer to one or more memory cells, and a plurality of memory cells can refer to two or more memory cells.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2.

FIG. 1 is a schematic diagram of a portion of a memory array 100 in accordance with a number of embodiments of the present disclosure. The embodiment of FIG. 1 illustrates a NAND architecture non-volatile memory array, such as, for instance, a portion of a three-dimensional (3D) NAND array. However, embodiments described herein are not limited to this example. As shown in FIG. 1, memory array 100 includes access lines 102-1, . . . , 102-N (individually or collectively referred to as access lines 102) and sense lines 104-1, 104-2, 104-3, . . . , 104-N (individually or collectively referred to as sense lines 104). The access lines 102 may also be referred to as conductive lines or word lines. The sense lines 104 may also be referred to as conductive lines, data lines, or bit lines. For ease of addressing in the digital environment, the number of access lines 102 and the number of sense lines 104 may be some power of two (e.g., 256 access lines by 4,096 sense lines).

Memory array 100 may include NAND strings 106-1, 106-2, 106-3, . . . , 106-N (individually or collectively referred to as NAND strings 106). Each NAND string 106 may include non-volatile memory cells 108-1, . . . , 108-N (individually or collectively referred to as memory cells 108), each communicatively coupled to a respective access line 102. Each NAND string 106 (and its constituent memory cells 108) may also be associated with a sense line 104. The non-volatile memory cells 108 of each NAND string 106 may be connected in series between a source select gate (SGS) (e.g., a field-effect transistor (FET)) 110, and a drain select gate (SGD) (e.g., FET) 112. Each source select gate 110 may be configured to selectively couple a respective NAND string 106 to a common source 114 responsive to a signal on source select line 116, while each drain select gate 112 may be configured to selectively couple a respective NAND string 106 to a respective sense line 104 responsive to a signal on drain select line 118.

As shown in the embodiment illustrated in FIG. 1, a source of source select gate 110 may be connected to the common source 114. A drain of source select gate 110 may be connected to memory cell 108-1 of the corresponding NAND string 106-1. The drain of drain select gate 112 may be coupled to sense line 104-1 of the corresponding NAND string 106-1 at drain contact 120-1. The source of drain select gate 112 may be coupled to memory cell 108-N (e.g., a floating-gate transistor) of the corresponding NAND string 106-1.

In a a number of embodiments, construction of non-volatile memory cells 108 may include a charge storage structure such as a floating gate, and a control gate. Non-volatile memory cells 108 may couple their control gates to access lines 102. A "column" of the non-volatile memory cells 108 may make up the NAND strings 106 and may be coupled to a given sense line 104. A "row" of the non-volatile memory cells may be those memory cells commonly coupled to a given access line 102. The use of the terms "column" and "row" is not meant to imply a particular linear (e.g., vertical and/or horizontal) orientation of the non-volatile memory cells 108. A NOR array architecture would be similarly laid out, except that the string of memory cells would be coupled in parallel between the select gates.

Subsets of cells coupled to a selected access line (e.g., 102-1, . . . , 102-N) can be programmed and/or sensed (e.g., read) together (e.g., at the same time). A program operation (e.g., a write operation) can include applying a number of program pulses (e.g., 16V-20V) to a selected access line in order to increase the threshold voltage (Vt) of selected cells coupled to that selected access line to a desired program voltage level corresponding to a target (e.g., desired) data state. A sense operation, such as a read or program verify operation, can include sensing a voltage and/or current change of a sense line coupled to a selected cell in order to determine the data state of the selected cell.

Figure 2:
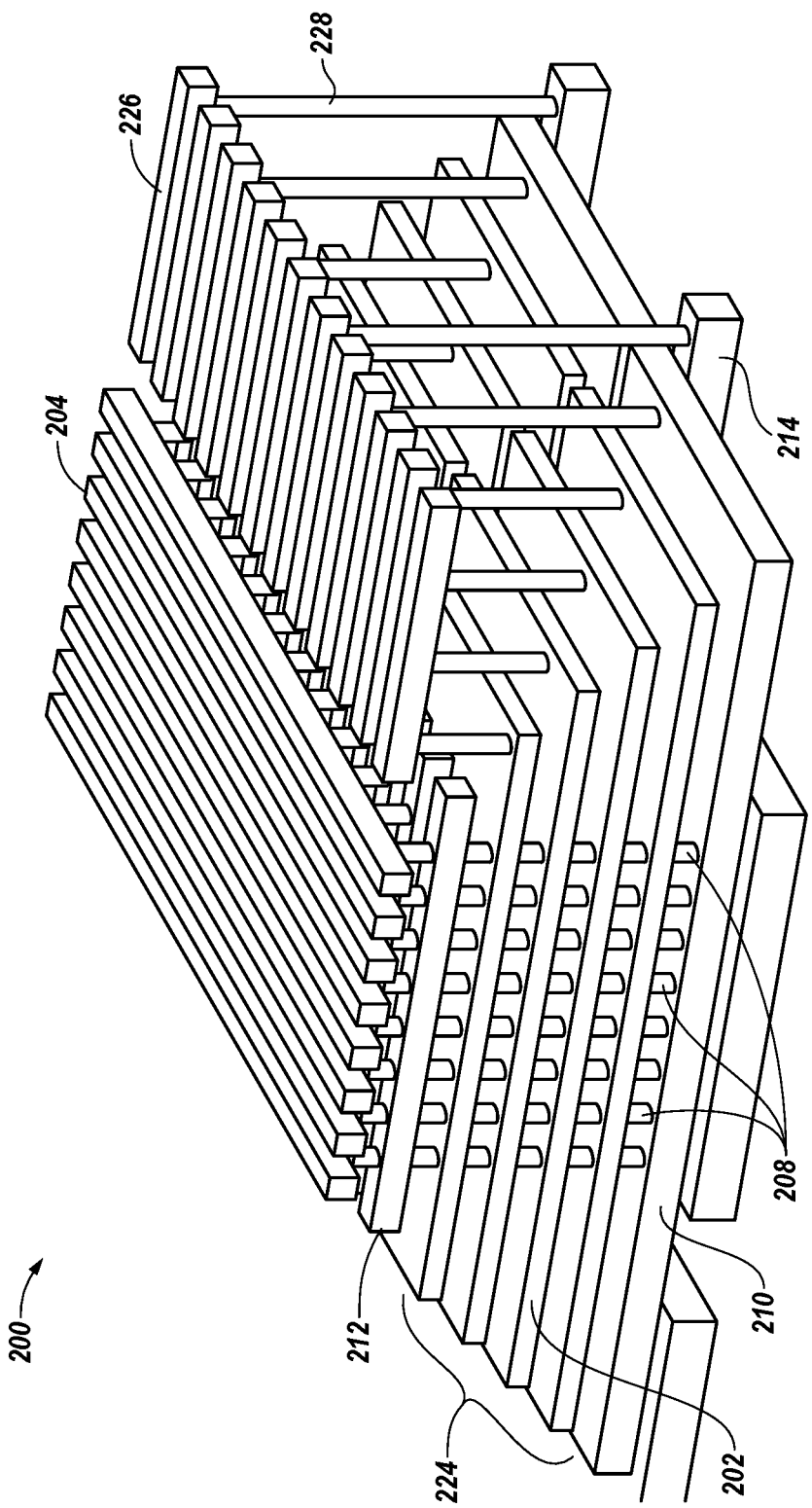
FIG. 2 is a perspective view of a portion of a three-dimensional memory array in accordance with a number of embodiments of the present disclosure.

FIG. 2 is a perspective view of a portion of a three-dimensional memory array 200 in accordance with a number of embodiments of the present disclosure. The 3D memory array 200 may comprise, for example, a NAND flash memory array, such as array 100 previously described in connection with FIG. 1. In some embodiments, memory array 200 may comprise a database. Memory array 200 may include a number of vertical strings of series-coupled memory cells 208 oriented orthogonal to a number of conductive lines, such as access lines 202 and/or sense lines 204.

A plurality of sense lines 204 may be oriented in a first plane, and further oriented in a first direction in the first plane, the vertical strings of series-coupled memory cells 208 being oriented orthogonal to the first plane. A plurality of access lines 202 may be oriented in a second plane, and further oriented in a second direction in the second plane. The access lines 202 may be formed in a planar configuration. The second plane may be substantially parallel to the first plane. The second direction may be perpendicular to the first direction, for example. The sense lines 204 may be shared by a number of vertical strings of series-coupled memory cells 208 in the first direction, and the access lines 202 may be shared by a number of vertical strings of series-coupled memory cells 208 in the second direction.

One or more source lines 214 may be oriented in a third plane, the third plane being substantially parallel to the first and second planes. The source lines 214 may be further oriented in the second direction, for instance, the same direction as the access lines 202 as shown in FIG. 2, or in a different direction. The select gates 212 and 210 may operate to select a particular vertical string of series-coupled memory cells 208 between a sense line 204 and a source line 214. As such, the vertical strings of series-coupled memory devices 208 may be located at the intersections of the sense lines 204 and source line 214.

The access lines 202 may be coupled to (and in some cases form) control gates of memory cells 208 at a particular level and may be used to select a particular one of the series-coupled memory cells 208 within a vertical string. In this manner, a particular memory cell 208 may be selected and electrically coupled to a sense line 204 via operation of the first select gate 212, second select gate 210, and an access line 202. The access lines 202 may be configured to select a memory cell 208 at a particular location within one or more of the vertical strings of series-coupled memory cells 208.

As illustrated in FIG. 2, the planar access lines 202 may be configured to have multiple three-dimensional stair step structures 224 to facilitate vertically-oriented coupling thereto, such as by vertical conductors 228. As such, respective planar access lines 202 may be formed as respective stair steps of the stair step structure 224. A stair step structure 224, as used herein, means a three-dimensional structure having a plurality of stair steps at different elevations extending to different distances in a lateral direction, such as is generally associated with a set of stair steps. According to one embodiment of the present disclosure, the steps of lower elevations may extend laterally beyond the lateral distance that the step at an immediately higher elevation extends, as shown in FIG. 2. For instance, lower steps may extend further in a lateral direction than step(s) above. A lower step may extend laterally a sufficient distance beyond a next higher step so that a vertical coupling may be made to the portion of the lower step extending laterally past the next higher step. In this manner, a vertical conductor 228 may be coupled to the lower step, such as to an access line 202, select gate 212 or 210, or source line 214, which each may correspond to a step in the stair step structure 224. In some embodiments, the vertical conductor 228 may extend down to additional circuitry, such as CMOS under array (e.g. CMOS under array 334 in FIG. 3B) circuitry.

The memory array 200 may be coupled to various circuitry associated with operating the memory array 200. Such circuitry may include string driver circuitry, for instance. As an example, horizontal conductive lines 226 may be routed from the memory array 200, for example, to a string driver. Steps of the stair step structure 224 may be coupled to the conductive lines 226, for instance, via the vertical conductors 228. In this manner, an electrical coupling may be made between the vertical stack of access lines 202, select gates 212 and 210, and/or source lines 214, and the string driver, via the planar horizontal conductive lines 226.

The strings of NAND memory cells (e.g. strings 106 of memory cells in FIG. 1) may be arranged with select gate transistors coupled at each end (e.g., source, drain). Each string may include a number of memory cells 208 coupled in series, drain-to-source. Vertical strings of NAND memory cells may be arranged such that the string of series-coupled memory cells are linearly arranged in a vertical orientation, or may be arranged in non-linear configuration such as in a "U" shape, with portions of the "U" shape being oriented vertically, for example. For instance, the string of series-coupled memory cells may be arranged in a dimension orthogonal to the planes encompassing the access lines (e.g., word lines) and sense lines (e.g., bit lines).

A memory device that includes array 200 may also include processing circuitry, such as page buffer circuitry (e.g., circuitry 338 later discussed in connection with FIG. 3B), error correction code (ECC) circuitry (e.g., ECC circuitry 337 later discussed in connection with FIG. 3C), and encryption/decryption circuitry (e.g., encryption/decryption circuitry 341 later discussed in connection with FIG. 3D). For instance, the processing circuitry can be formed on the same chip as array 200. The processing circuitry can receive, from a host, a query for data stored in array 200, and search portions of array 200 for the data. The processing circuitry can determine data stored in the portions of array 200 that matches (e.g., perfectly and/or exactly matches) the query, and transfer only the data that matches the query to the host.

For example, the processing circuitry can receive a query from a host (e.g., host 554 discussed later in connection with FIG. 5) for some particular data stored in array 200. The particular data may correspond to a search key generated by the host, and the query can comprise a command to search for the particular data (e.g., for any data stored in the portions of array 200 that corresponds to the search key). The query may be issued by a user of the host, which can send the query to the processing circuitry, as will be further described herein (e.g., in connection with FIG. 5).

As used herein, the term "query" may refer to a request for data or information from a database or a combination of databases. The query for the particular data stored in array 200 may include a query for data corresponding to a number of data fields. The data fields may include a logical block address (LBA) number, an LBA offset, and a count of bits that match or do not match corresponding bits in a search key. As used herein, the term "bit" may refer to a portion of data that can be stored in a memory cell. As used herein, the term "search key" may refer to an attribute or a set of attributes that are used to access a database record, and the particular data may correspond to the search key if it matches the attribute(s). In some examples, the host may generate the search key. As used herein, the term "match" may refer to a perfect and/or exact match. For instance, a portion of data may match the query (e.g., match the search key for the query) if (e.g., only if) the bits of data stored in that portion of data perfectly and/or exactly match the corresponding bits in the search key.

Upon receiving the query from the host, the processing circuitry can execute (e.g., run) the query by searching portions of the array 200, such as, for instance, different strings of memory cells of array 200, for the particular data corresponding to the search key, and determining (e.g., identifying) data stored in the portions of array 200 that matches the search key. The processing circuitry can execute the query on each of the different portions of array 200 in parallel.

Upon executing the query (e.g., determining the data stored in the portions of array 200 that matches the search key), the processing circuitry can transfer (e.g., send and/or output) only the data determined to match the query (e.g., only the data determined to match the search key) to the host. That is, only the particular (e.g., specific) data for which the query was issued is transferred to the host, with no data stored in array 200 that does not match the query being transferred to the host.

The processing circuitry can determine the data that matches the search key based on the amount of current conducted by the portions of array 200 (e.g., by each respective memory cell string) when a current and/or voltage is applied to that portion (e.g., by applying a voltage to the sense line of that memory cell string). For example, the amount of current conducted by a portion of array 200 may be greater when the memory cells in that portion of array 200 store data corresponding to bits in the search key than when the memory cells in that portion of array 200 store data that does not correspond to the bits in the search key. This may occur because a memory cell in the portion of array 200 may conduct current if its data matches a corresponding bit in the search key, but may not conduct current if its data does not match any corresponding bits in the search key. Accordingly, the data stored in the portion of array 200 that conducts the highest amount of current (e.g., a greater amount of current than all other portions of the array) can be determined to be the data that matches the search key.

In some embodiments, the processing circuitry (e.g., the ECC circuitry) can perform an error correction operation on the data stored in the portions of array 200 to determine the data that matches the query. For example, the processing circuitry can sense the data (e.g., bits of data) stored in the portions of array 200, and perform an error correction operation on the sensed data to correct any errors in the bits of data. The processing circuitry can perform the error correction operation (e.g., correct the errors in the data) using, for instance, an error correction code that can be stored in array 200. The processing circuitry can then determine the data that matches the query after correcting the errors in the data.

As an example, the processing circuitry can, after sensing the data stored in the portions of array 200, first determine the data stored in the portions of array 200 that corresponds more closely to the search key than other data stored in the portions of array 200. As used herein, the term "more closely" may refer to a threshold number of bits in the data being the same as the corresponding bits in the search key. For instance, a portion of data may correspond more closely to the search key than other data if the portion of data includes more bits that match corresponding bits in the search key than the other data, and/or if the number of bits in the portion of data that match the corresponding bits in the search key exceeds the threshold number of bits. The processing circuitry can determine the data that corresponds more closely to the search key based on the amount of current conducted by the portions of array 200 when a current and/or voltage is applied to that portion, as previously described above. The processing circuitry can then perform the error correction operation on the data determined to correspond more closely to the search key, such that only errors occurring in the data determined to correspond more closely to the search key are corrected. The processing circuitry can then determine the data that matches the query (e.g., that exactly matches the search key) after the performing the error correction operation on the data determined to correspond more closely to the search key. That is, the processing circuitry can determine which of the data determined to correspond more closely to the search key is the data that exactly matches the search key after correcting the errors in the more closely corresponding data.

In some embodiments, the data stored in the portions of array 200 may be (e.g., may have been previously) encrypted by the processing circuitry (e.g., by the encryption/decryption circuitry). For instance, the processing circuitry can encrypt the bits of data stored in each portion of array 200. In such embodiments, the processing circuitry (e.g., the encryption/decryption circuitry) can decrypt the encrypted data stored in the portions of array 200 prior to determining the data that matches the query. For example, the processing circuitry can sense the encrypted data, and then decrypt the encrypted sensed data. The processing circuitry can encrypt and decrypt the data using, for instance, an encryption and decryption algorithm. The processing circuitry can then determine the data that matches the query after decrypting the encrypted data. In examples in which the processing circuitry also performs an error correction operation on (e.g. corrects errors occurring in) the data stored in the portions of array 200 prior to determining the data that matches the query, the processing circuitry can perform the error correction operation on the encrypted data, and then decrypt the data after performing the error correction operation.

After the processing circuitry has determined the data that matches the query, the processing circuitry (e.g., the encryption/decryption circuitry) can encrypt (e.g., re-encrypt) the data, and then transfer the encrypted matching data to the host. The host can decrypt the data that matches the query upon receipt of the encrypted matching data.

FIGS. 3A-3D are top-down views of different levels of (e.g., within) a three-dimensional memory array, such as, for instance, array 200 previously described in connection with FIG. 2, in accordance with a number of embodiments of the present disclosure. Other components included in a level of the 3D memory array may be omitted for ease of illustration.

Figure 3A:
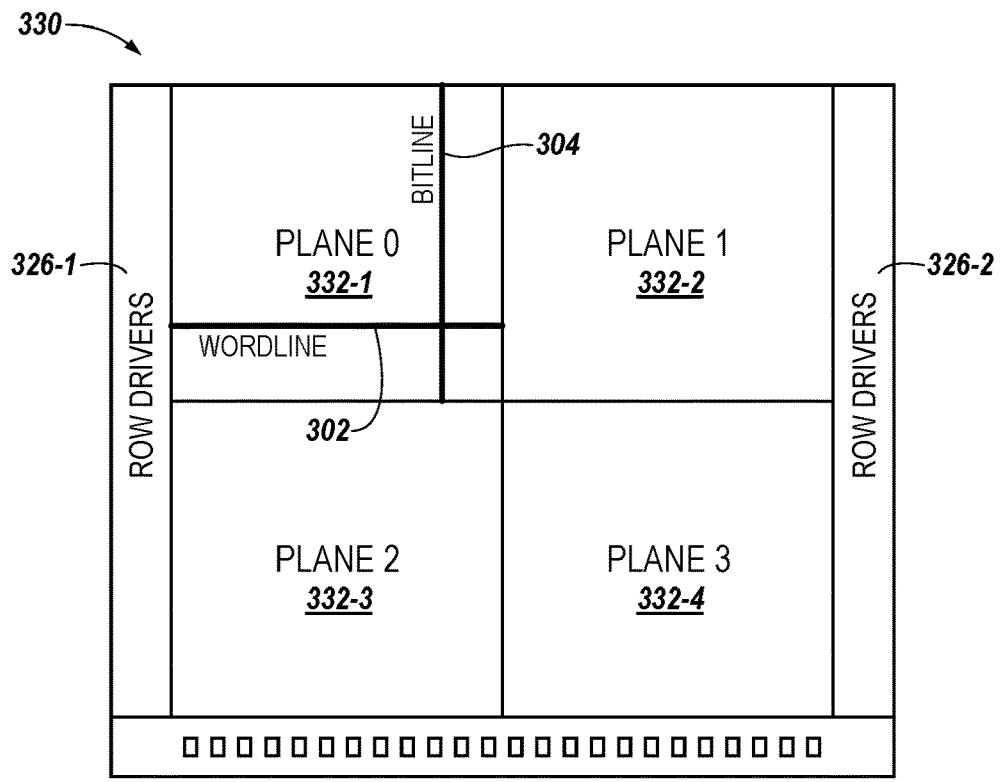
FIGS. 3A-3D are top-down views of different levels of a three-dimensional memory array in accordance with a number of embodiments of the present disclosure.

FIG. 3A illustrates a level 330 of a 3D memory array in accordance with the present disclosure. The level 330 of the 3D memory array may be one of the steps of the stair step structure of the array (e.g. stair step structure 224 of FIG. 2). The level 330 may be segmented into multiple planes of memory cells. For example, the level 330 may include a first plane (e.g. plane 0) 332-1, a second plane (e.g. plane 1) 332-2, a third plane (e.g. plane 2) 332-3, and a fourth plane (e.g. plane 3) 332-4 (individually or collectively referred to as planes 332). As illustrated, the first plane 332-1 may include a sense (e.g., bit) line 304 and an access (e.g., word) line 302. Although not shown in FIG. 3A, the second plane 332-2, the third plane 332-3, and the fourth plane 332-4 may also include access lines and sense lines. The level 330 may also include conductive lines (e.g. row drivers) 326-1 and 326-2 (individually or collectively referred to as conductive line 326). In some embodiments, the row drivers 326 may be contiguous to the planes 332.

Figure 3B:
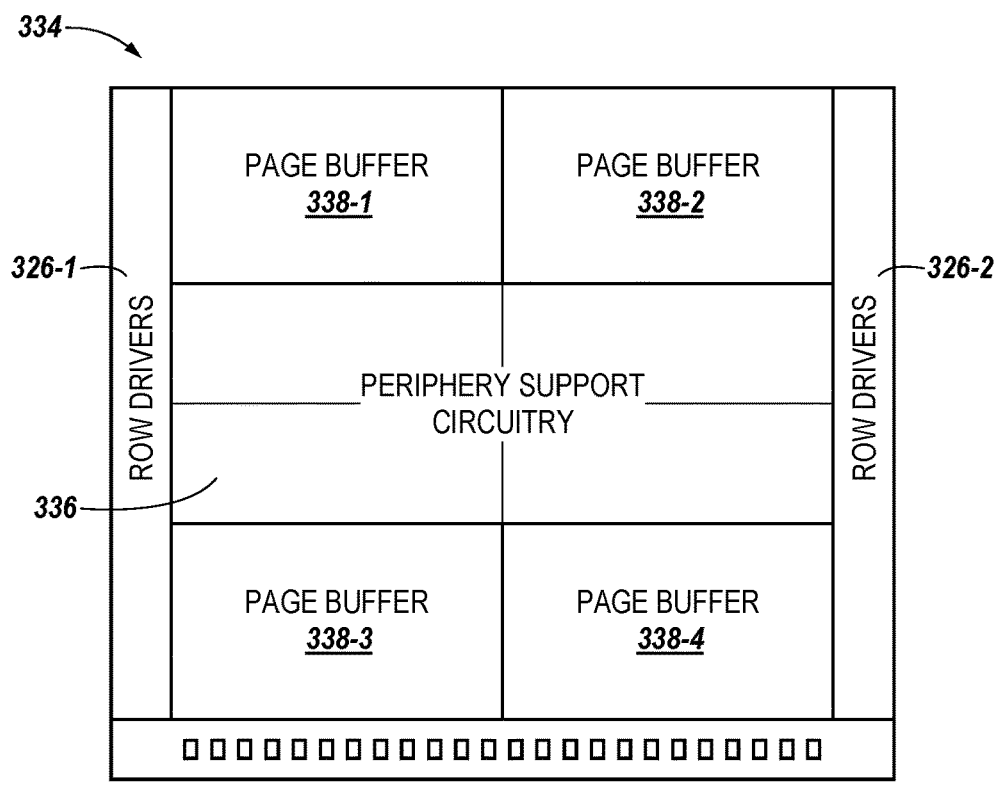

FIG. 3B illustrates another level 334 of a 3D memory array in accordance with the present disclosure. In some embodiments, the level 334 may be under the stair step structure of the 3D memory array. For example, the level 334 may be a complementary metal oxide semiconductor (CMOS) under array structure. As used herein, the term "CMOS under array" may refer to logic circuitry for a memory array that is formed below the memory array. The level 334 (e.g., the circuitry of level 334) may be segmented into multiple page buffers that each correspond to a different one of the planes of memory cells. For example, the level 334 may include a first page buffer 338-1 that corresponds to plane 0, a second page buffer 338-2 that corresponds to plane 1, a third page buffer 338-3 that corresponds to plane 2, and a fourth page buffer 338-4 that corresponds to plane 3. The level 334 may also include periphery support circuitry 336, and conductive lines (e.g. row drivers) 326-1 and 326-2 that are contiguous to the page buffers 338 and the periphery support 336.

Figure 3C:
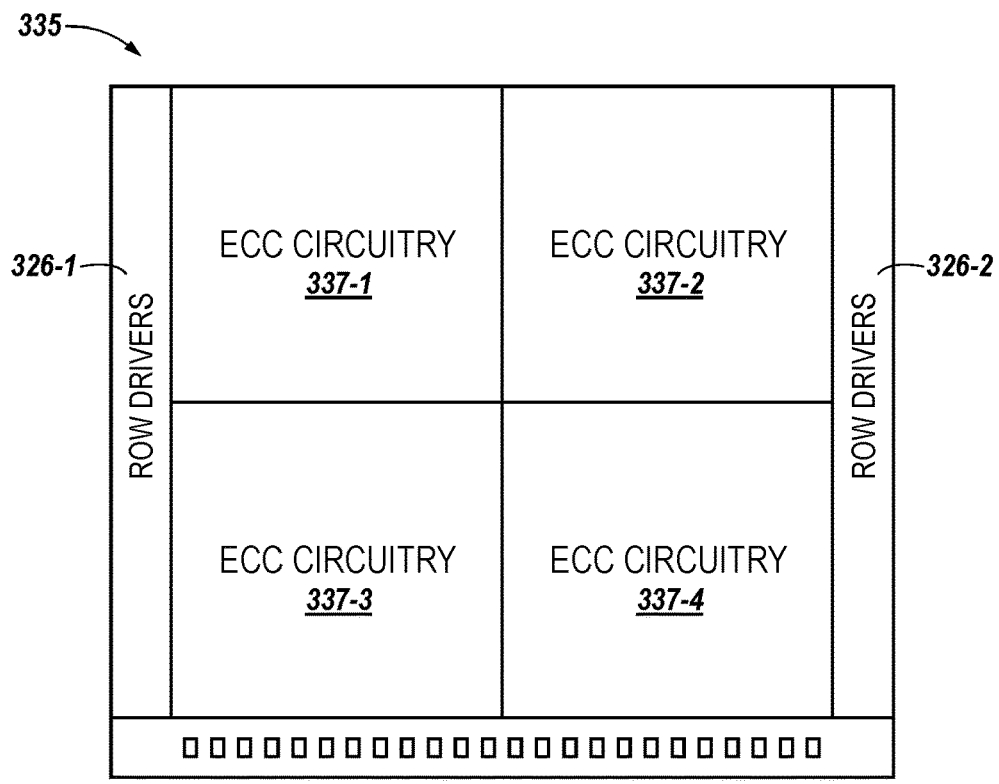

FIG. 3C illustrates another level 335 of a 3D memory array in accordance with the present disclosure. In some embodiments, the level 335 may replace one of the steps of the stair step structure of the 3D memory array. The level 335 (e.g., the circuitry of level 335) may be segmented into multiple error correction component (ECC) circuitries that each correspond to a different one of the planes of memory cells and can perform the error correction functionality previously described herein. For example, the level 335 may include ECC circuitry 337-1 that corresponds to plane 0, ECC circuitry 337-2 that corresponds to plane 1, ECC circuitry 337-3 that corresponds to plane 2, and ECC circuitry 337-4 that corresponds to plane 3. The level 335 may also include conductive lines (e.g. row drivers) 326-1 and 326-2 that are contiguous to the ECC circuitries 337.

Figure 3D:
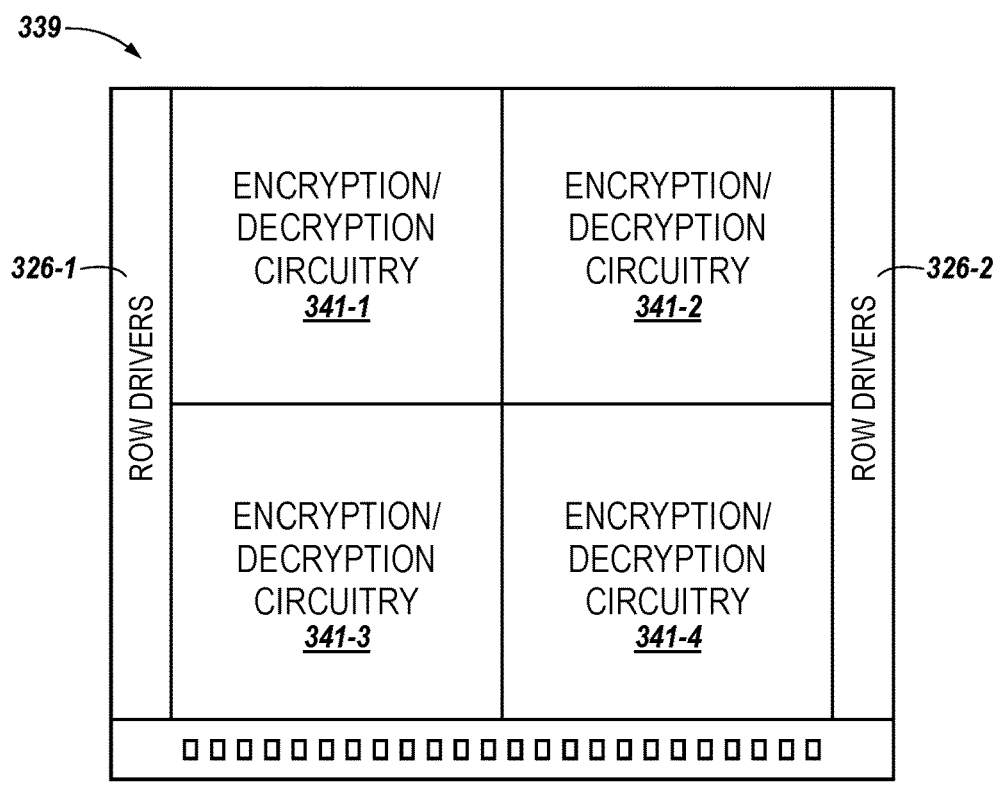

FIG. 3D illustrates another level 339 of a 3D memory array in accordance with the present disclosure. In some embodiments, the level 339 may replace one of the steps of the stair step structure of the 3D memory array (e.g., a different step than the step replaced by level 335). The level 339 (e.g., the circuitry of level 339) may be segmented into multiple encryption/decryption circuitries that each correspond to a different one of the planes of memory cells and can perform the encryption and decryption functionality previously described herein. For example, the level 339 may include encryption/decryption circuitry 341-1 that corresponds to plane 0, encryption/decryption circuitry 341-2 that corresponds to plane 1, encryption/decryption circuitry 341-3 that corresponds to plane 2, and encryption/decryption circuitry 341-4 that corresponds to plane 3. The level 339 may also include conductive lines (e.g. row drivers) 326-1 and 326-2 that are contiguous to the encryption/decryption circuitries 341.

Figure 4:
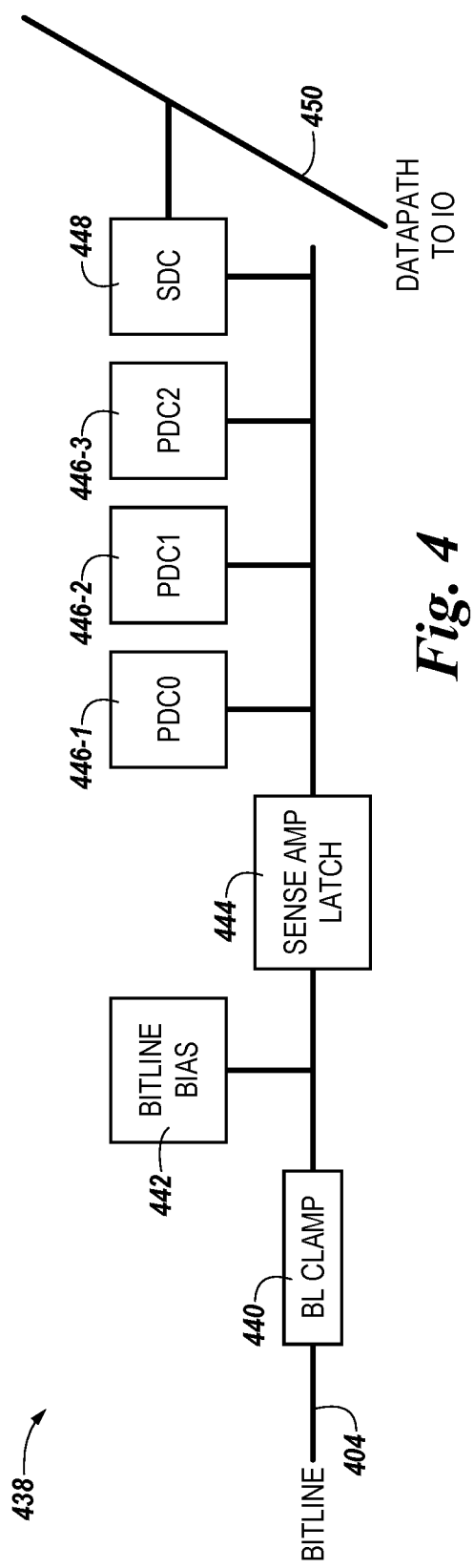
FIG. 4 is a block diagram of circuitry for the acceleration of data queries in memory in accordance with a number of embodiments of the present disclosure.

FIG. 4 is a block diagram of circuitry 438 for the acceleration of data queries in memory in accordance with a number of embodiments of the present disclosure. Circuitry 438 can be, for instance, a page buffer that is included in level 334 previously described in connection with FIG. 3B.

The circuitry 438 may include a sense (e.g. bit) line 404 that includes a sense line clamp 440, sense line bias circuitry 442, a sense amplifier (amp) latch 444, primary data caches 446-1, 446-2, and 446-3 (individually or collectively referred to as primary data caches 446), a secondary data cache 448, and an input/output (I/O) bus 450.

The sense line 404 may allow current to travel through the memory array. For instance, current can be provided to the string of memory cells coupled to sense line 404 by applying a current and/or voltage to sense line 404. The sense (e.g., bit) line clamp 440 may comprise a number of transistors that limit the amount of voltage that is applied across the sense line 404. By limiting the amount of voltage that is applied across the sense line 404, the sense line clamp 440 may protect the electrical components of the memory from receiving voltages that are larger than the intended voltages for the electrical components.

The sense line 404 may include (e.g., be coupled to) sense (e.g., bit) line bias circuitry 442. As used herein, the term "sense line bias circuitry" may refer to an electrical component that applies a current to the sense line 404 to keep a voltage across the sense line 404 in a certain range. The sense line bias circuitry 442 may work alongside the sense line clamp 440 to provide the intended level of voltage to the other electrical components on the sense line 404.

The sense line 404 may also include a sense amp latch 444. The sense amp latch 444 may be a part of read circuitry that is used to read data stored in a memory cell. By using circuitry including a sense amp latch 444 to read the data stored in a memory cell, the data stored in the memory cell may be compared to the search key to determine if the data is the same as a corresponding bit in the search key, as described herein.

The sense line 404 may include the primary data caches 446 and a secondary data cache 448. The primary data caches 446 may store frequently requested data and instructions so they are immediately available to the central processing unit (CPU). In some embodiments, the primary data caches 446 may be used as intermediate data storage for read operation algorithms and program algorithms. The secondary data cache 448 may be used for sending data to the I/O bus 450 and receiving data from the I/O bus. In some embodiments, the I/O bus 450 may couple to a host (e.g. host 554 in FIG. 5) and exchange data between the host and a memory device.

The circuitry 438 may receive a data query from a host and transfer data that matches a search key of the query as described in reference to FIGS. 1-3 and 5. By configuring the circuitry 438 to perform the functions as described herein, the circuitry may accelerate the speed of data queries in the 3D memory array. The circuitry 438 may be configured to perform functions, such as comparing portions of data to a search key and determining the data that matches the search key, that may have been performed by a host in previous approaches. This may allow the query to be performed faster than previous approaches by performing these functions in the memory device instead of transferring the data out of the memory device (e.g., to the host) to perform the functions. This may increase the speed of the functions because it may reduce (e.g. eliminate) the time lag in performing the function caused by transferring the data out of the memory device before performing the functions.

Figure 5:
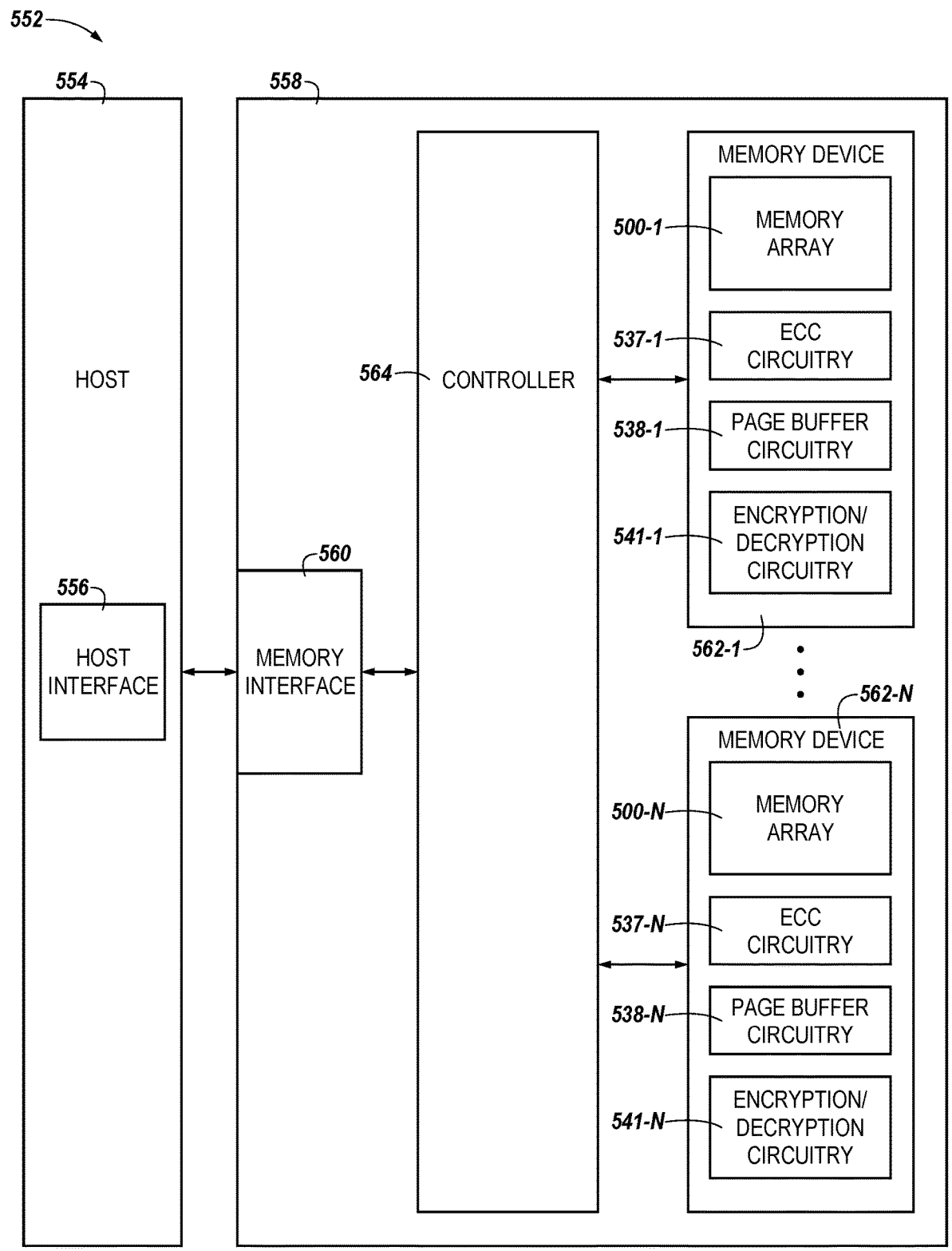
FIG. 5 is a functional block diagram of a computing system for acceleration of data queries in memory in accordance with a number of embodiments of the present disclosure.

FIG. 5 is a functional block diagram of a computing system 552 for acceleration of data queries in memory in accordance with a number of embodiments of the present disclosure. In the embodiment illustrated in FIG. 5, computing system 552 includes a host 554 and a memory system 558. Memory system 558 may include a memory interface 560, a number of memory devices 562-1, . . . 562-N (individually or collectively referred to as memory devices 562), and a controller 564 coupled to the memory interface 560 and memory devices 562.

Host 554 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like. As shown in FIG. 5, host 554 may be associated with (e.g., include or be coupled to) a host interface 556. The host interface 556 may be used to communicate information between host 554 and memory system 558.

Memory interface 560 may be used to communicate information between memory system 558 and another device, such as host 554. Memory interface 560 may be in the form of a standardized physical interface. For example, when memory system 558 is used for information (e.g., data) storage in computing system 552, memory interface 560 may be a serial advanced technology attachment (SATA) interface, a peripheral component interconnect express (PCIe) interface, or a universal serial bus (USB) interface, among other physical connectors and/or interfaces. In general, however, memory interface 560 may provide an interface for passing control, address, information, scaled preferences, and/or other signals between the controller 564 of memory system 558 and a host 554 (e.g., via host interface 556).

Controller 564 may include, for example, firmware and/or control circuitry (e.g., hardware). Controller 564 may be operably coupled to and/or included on the same physical device (e.g., a die) as one or more of the memory devices 562-1, . . . , 562-N. For example, controller 564 may be, or may include, an ASIC as hardware operably coupled to circuitry (e.g., a printed circuit board) including memory interface 560 and memory devices 562. Alternatively, controller 564 may be included on a separate physical device that is communicatively coupled to the physical device (e.g., the die) that includes one or more of the memory devices 562.

Controller 564 may communicate with memory devices 562 to direct operations to sense (e.g., read), program (e.g., write), and/or erase information, among other functions and/or operations for management of memory cells. Controller 564 may have circuitry that may include a number of integrated circuits and/or discrete components. In a number of embodiments, the circuitry in controller 564 may include control circuitry for controlling access across memory devices 562 and/or circuitry for providing a translation level between host 554 and memory system 558.

Memory devices 562 may include, for example, a number of memory arrays 500 (e.g., arrays of memory cells). Arrays 500 can be, for instance, 3D NAND arrays analogous to memory array 200 described in connection with FIG. 2. Memory devices 562 may be formed on the same die. A memory device (e.g., memory device 562-1) may include one or more arrays of memory cells formed on the die.

As shown in FIG. 5, a memory device 562 may include ECC circuitry 537, page buffer circuitry 538, and encryption/decryption circuitry 541 associated with the one or more arrays formed on the die, or portions thereof (e.g., memory device 562-1 may include ECC circuitry 537-1, page buffer circuitry 538-1, and encryption/decryption circuitry 541-1 associated with array 500-1). The ECC circuitry 537, page buffer circuitry 538, and encryption/decryption circuitry 541 of a memory device 562 may comprise the processing circuitry described in connection with FIG. 2. For example, the processing circuitry (e.g., page buffer circuitry 538) may be utilized to sense particular data values, in addition to directing storage, erasure, etc., of data values in response to a command from host 554 and/or host interface 556. The command may be sent directly to the processing circuitry via the memory interface 560 or to the processing circuitry via the controller 564.

The processing circuitry can receive, from host 554, a query for data stored in arrays 500, and search portions of the arrays 500 for the data. The processing circuitry can determine the data stored in the portions of the arrays 500 that matches the query, and transfer only the data that matches the query to the host 554.

For example, the host 554 can send a query to the memory system 558 for particular data stored in arrays 500, and generate a search key to denote the particular data. The query may include a command to search for the particular data in the memory devices 562. In some embodiments, the data stored in arrays 500, including the particular data denoted in the search key, may be encrypted by encryption/decryption circuitry 541 (e.g., the data stored in array 500-1 may be encrypted by encryption/decryption circuitry 541-1, etc.), as previously described herein. Further, the memory devices 562 may only recognize the data in its encrypted form. Accordingly, the query may request the data in its encrypted form, and host 554 can decrypt the requested data (e.g., the data that matches the query) received from memory system 558. In some embodiments, the query sent by host 554 can be encrypted, and can be decrypted by controller 564. In other embodiments, the query sent by host 554 can be unencrypted.

In response to receiving the query from the host 554, memory devices 562 (e.g., the processing circuitry of the memory devices) may be configured to search portions of the respective arrays 500 for the particular data and count the number of bits in each portion of the arrays that match a corresponding bit in the particular data denoted by the search key. This count may be performed to determine the data stored in the portions of the respective arrays 500 that matches the query. The memory devices 562 can then transfer the data that matches the query to the host 554.

The host 554 may set parameters for the number of bits in each portion of the respective arrays 500 that would need to match, or not match, the corresponding bits in the search key to result in a determination that the data stored in that portion of the array matches the query. For instance, host 554 may set a minimum mismatch bit count for the query, or a maximum mismatch bit count for the query. If the number of bits in a portion of the array that do not match a corresponding bit in the search key is lower than the minimum mismatch bit count for the query, or greater than the maximum mismatch bit count for the query, it can be determined that the data stored in that portion of the array does not match the query.

Memory arrays 500 may have errors randomly distributed amongst the data stored therein, including the particular data denoted in the search key. Accordingly, ECC circuitry 537 can perform an error correction operation on the data stored in the portions of array 500 to determine the data that matches the query (e.g., ECC circuitry 537-1 can perform an error correction operation on the data stored in the portions of array 500-1, etc.), as previously described herein. The error correction code used by the ECC circuitry to perform the error correction operation can be stored in the array (e.g., the error correction code used by ECC circuitry 537-1 can eb stored in array 500-1, etc.).

In some embodiments, the memory cells in the memory arrays 500 may be grouped together in pages of memory cells. A typical page of a NAND device may be sixteen kilobytes (KB). The processing circuitry of a memory device 562 may search an entire page of memory cells in parallel when searching for the data that matches the query.

The embodiment illustrated in FIG. 5 may include additional circuitry that is not illustrated so as not to obscure embodiments of the present disclosure. For example, memory devices 562 may include address circuitry to latch address signals provided over I/O connectors through I/O circuitry. Address signals may be received and decoded by a row decoder and a column decoder to access a memory array 500. It will be appreciated that the number of address input connectors may depend on the density and/or architecture of memory devices 562 and/or memory arrays 500.

Figure 6:
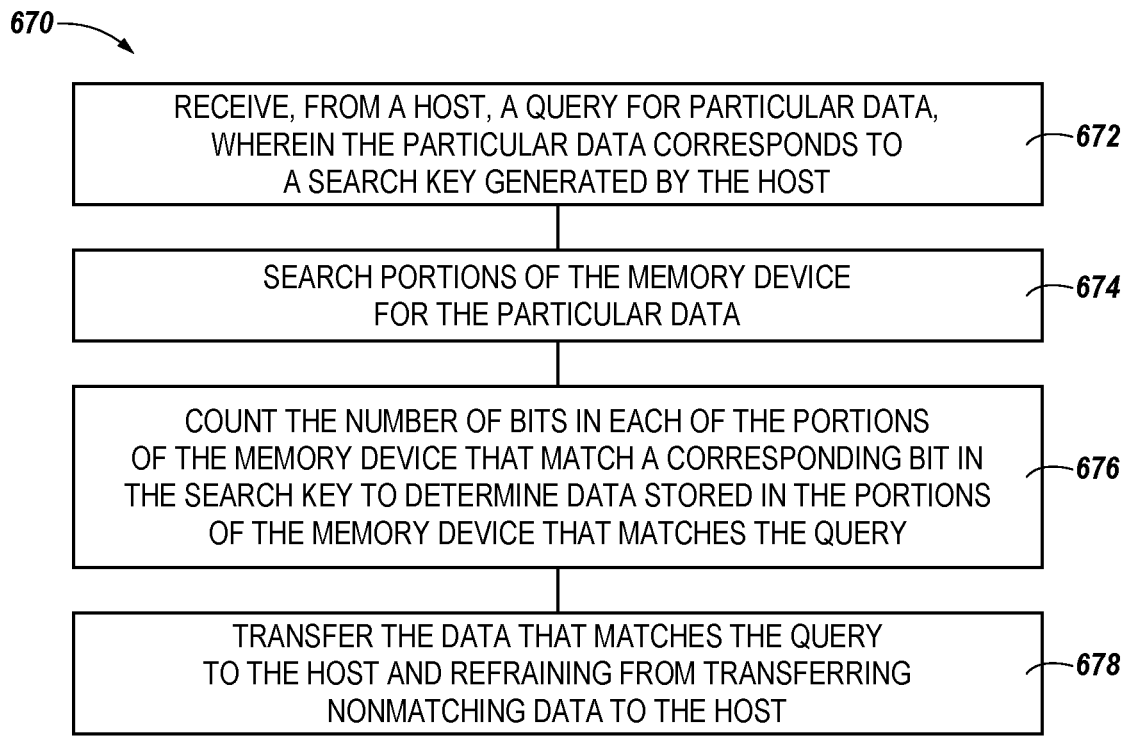
FIG. 6 is a method for acceleration of data queries in memory in accordance with a number of embodiments of the present disclosure.

FIG. 6 is a method 670 for acceleration of data queries in memory in accordance with a number of embodiments of the present disclosure. Method 670 can be performed by, for example, memory devices 562 previously described in connection with FIG. 5.

At block 672, method 670 includes receiving, from a host (e.g., host 554 previously described in connection with FIG. 5), a query for particular data, wherein the particular data corresponds to a search key generated by the host. For instance, the query can be analogous to the queries previously described herein, and the particular data can be particular data stored in arrays of the memory device, as previously described herein.

At block 674, method 670 includes searching portions of the memory device for the particular data. For instance, portions of the arrays of the memory device can be searched for the particular data, in a manner analogous to that previously described herein.

At block 676, method 670 includes counting the number of bits in each of the portions of the memory device that match a corresponding bit in the search key to determine data stored in the portions of the memory device that matches the query. Parameters for the number of bits in each portion of the device that would need to match, or not match, the corresponding bits in the search key to result in a determination that the data stored in that portion of the device matches the query can be set by the host, as previously described herein. The number of bits each portion of the device that match a corresponding bit in the search key can be determined based on the amount of current conducted by that portion of the device when a current and/or voltage is applied to that portion, as previously described herein.

At block 678, method 670 includes transferring the data that matches the query to the host and refraining from transferring nonmatching data to the host. That is, only the data that matches the query is transferred to the host, as previously described herein.

Figure 7:
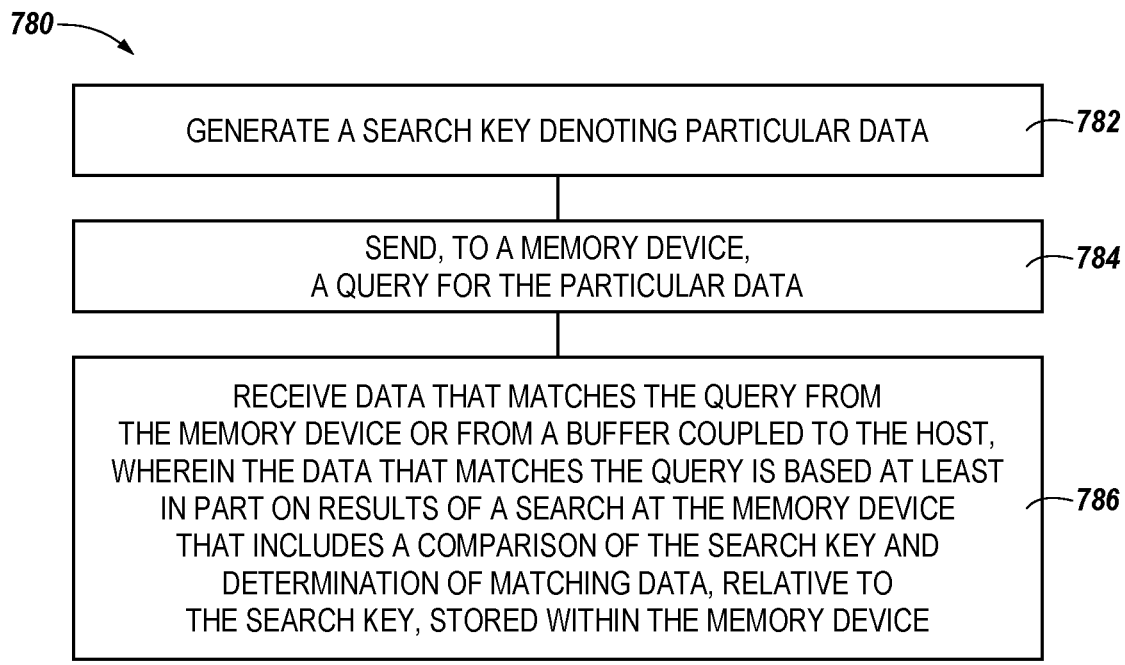
FIG. 7 is an additional method for acceleration of data queries in memory in accordance with a number of embodiments of the present disclosure.

FIG. 7 is a method 780 for acceleration of data queries in memory in accordance with a number of embodiments of the present disclosure. Method 780 can be performed by, for example, host 554 previously described in connection with FIG. 5.

At block 782, method 780 includes generating a search key denoting particular data. For instance, the search key can be analogous to the search keys previously described herein, and the particular data can be particular data stored in arrays of a memory device (e.g., memory devices 562 of FIG. 5), as previously described herein.

At block 784, method 780 includes sending, to a memory device (e.g., memory devices 562 of FIG. 5), a query for the particular data. For instance, the query can be analogous to the queries previously described herein.

At block 786, method 780 includes receiving data that matches the query from the memory device or from a buffer coupled to the host, wherein the data that matches the query is based at least in part on results of a search at the memory device that includes a comparison of the search key and determination of matching data, relative to the search key, stored within the memory device. For instance, the data that matches the query can be determined by the memory device in a manner analogous to that previously described herein.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   processing circuitry configured to:
      receive, from a host, a query for particular data stored in the array of memory cells, wherein the particular data corresponds to a search key generated by the host;
      search portions of the array of memory cells for the particular data corresponding to the search key;
      count a quantity of bits in each of the portions of the array of memory cells that match a corresponding bit in the search key;
      compare the quantity of bits in each respective portion of the array of memory cells that match the corresponding bit in the search key to a mismatch bit count for the query;
      determine whether data stored in each respective portion of the array matches the query based on the comparison; and
      transfer the data that matches the query to the host.

2. The apparatus of claim 1, wherein the processing circuitry is configured to refrain from transferring data that does not match the query to the host.

3. The apparatus of claim 1, wherein:
   the bits in each of the portions of the array of memory cells are encrypted; and
   the processing circuitry is configured to decrypt the encrypted bits.

4. The apparatus of claim 1, wherein the processing circuitry is configured to determine the data stored in a respective portion of the array does not match the query upon the comparison indicating the quantity of bits in that respective portion is lower than the mismatch bit count.

5. The apparatus of claim 1, wherein the processing circuitry is configured to determine the data stored in a respective portion of the array does not match the query upon the comparison indicating the quantity of bits in that respective portion is greater than the mismatch bit count.

6. The apparatus of claim 1, wherein the mismatch bit count is set by the host.

7. The apparatus of claim 1, wherein the processing circuitry is configured to count the quantity of bits in a respective portion of the array of memory cells that match the corresponding bit in the search key based on an amount of current conducted by that respective portion when a current is applied to that respective portion.

8. The apparatus of claim 1, wherein the processing circuitry is configured to count the quantity of bits in a respective portion of the array of memory cells that match the corresponding bit in the search key based on an amount of current conducted by that respective portion when a voltage is applied to that respective portion.

9. A method, comprising:
   receiving, by a memory device from a host, a query for particular data, wherein the particular data corresponds to a search key generated by the host;
   searching, by the memory device, portions of the memory device for the particular data, wherein the searching includes:
      sensing, by the memory device, data stored in the portions of the memory device;
      performing, by the memory device, an error correction operation on the sensed data; and
      decrypting, by the memory device, the sensed data after performing the error correction operation on the sensed data;
   counting, by the memory device, a quantity of bits in each of the portions of the memory device that match a corresponding bit in the search key to determine data stored in the portions of the memory device that matches the query; and transferring the data that matches the query to the host.

10. The method of claim 9, wherein the method includes performing the error correction operation on the sensed data using an error correction code stored in the memory device.

11. The method of claim 9, wherein the method includes performing the error correction operation on the sensed data by error correction code (ECC) circuitry of the memory device.

12. The method of claim 9, wherein the method includes decrypting the sensed data by encryption/decryption circuitry of the memory device.

13. The method of claim 9, wherein the method includes decrypting the sensed data using a decryption algorithm.

14. The method of claim 9, wherein the method includes:
searching the portions of the memory device for the particular data using circuitry that is resident on the memory device; and
counting the quantity of bits in each of the portions of the memory device that match the corresponding bit in the search key using the circuitry that is resident on the memory device.

15. The method of claim 9, wherein the method includes:
searching each of the portions of the memory device for the particular data in parallel; and
counting the quantity of bits in each of the portions of the memory device that match the corresponding bit in the search key in parallel.

16. A method, comprising:
generating, by a host, a search key denoting particular data;
sending, to a memory device by the host, a query for the particular data; and
receiving data that matches the query at the host, wherein:
the data that matches the query is based at least in part on results of a search at the memory device that includes a comparison of the search key and determination of matching data, relative to the search key, stored within the memory device; and
the data that matches the query comprises data whose quantity of bits that match a corresponding bit in the search key is greater than a mismatch bit count for the query.

17. The method of claim 16, wherein the method includes receiving the data that matches the query at the host from the memory device.

18. The method of claim 16, wherein the method includes receiving the data that matches the query at the host from a buffer coupled to the host.

19. The method of claim 16, wherein the data that matches the query comprises data that exactly matches the query.

* * * * *